United States Patent
Lee et al.

(10) Patent No.: US 7,320,173 B2
(45) Date of Patent: Jan. 22, 2008

(54) METHOD FOR INTERCONNECTING MULTI-LAYER PRINTED CIRCUIT BOARD

(75) Inventors: Sung-Gue Lee, Gyeonggi-Do (KR); Jung-Ho Hwang, Gyeonggi-Do (KR); Joon-Wook Han, Gyeonggi-Do (KR); Sang-Min Lee, Gyeonggi-Do (KR); Tae-Sik Eo, Gyeonggi-Do (KR); Yu-Seock Yang, Seoul (KR)

(73) Assignee: LG Electronics Inc., Seoul (KR)

( * ) Notice: Subject to any disclaimer, the term of this patent is extended or adjusted under 35 U.S.C. 154(b) by 178 days.

(21) Appl. No.: 10/769,885

(22) Filed: Feb. 3, 2004

(65) Prior Publication Data

US 2004/0154162 A1    Aug. 12, 2004

Related U.S. Application Data

(60) Provisional application No. 60/463,322, filed on Apr. 17, 2003.

(30) Foreign Application Priority Data

Feb. 6, 2003    (KR)    ............ 10-2003-0007572

(51) Int. Cl.
*H05K 3/02*    (2006.01)
*H05K 3/10*    (2006.01)

(52) U.S. Cl. ............ 29/846; 29/830; 29/842; 174/261; 216/18; 427/97.1

(58) Field of Classification Search ............ 29/830, 29/832, 842, 846, 852, 831, 847, 851; 174/256, 174/261, 262, 265; 216/18, 38, 105; 361/748–751; 427/97.1

See application file for complete search history.

(56) References Cited

U.S. PATENT DOCUMENTS

| 3,953,924 | A | * | 5/1976 | Zachry et al. ............ 29/830 |
| 5,046,238 | A | * | 9/1991 | Daigle et al. ............ 29/830 |
| 5,092,032 | A | * | 3/1992 | Murakami ............ 29/830 |
| 5,595,943 | A | * | 1/1997 | Itabashi et al. ............ 427/97.7 |

(Continued)

FOREIGN PATENT DOCUMENTS

JP    7-302977    11/1995

OTHER PUBLICATIONS

Chinese Office Action dated Apr. 14, 2006 (with English Translation).

*Primary Examiner*—Minh Trinh
*Assistant Examiner*—Donghai D. Nguyen
(74) *Attorney, Agent, or Firm*—Ked & Associates, LLP

(57) ABSTRACT

A method for fabricating a multi-layer printed circuit board can include forming an etching resist layer on a first metal layer having plating grooves that selectively expose the first metal layer, forming a plated layer at the surface of the first metal layer exposed by the plating groove through a plating process to form connection protrusion, removing the etching resist layer, forming an insulation layer at the first metal layer and positioning a second metal layer at the surface of the insulation layer coupled to an end portion of the connection protrusion. By forming the connection protrusion through the plating process, a loss of material can be reduced and a strength of the connection protrusion can be increased. Further, a complexity of the fabrication process is reduced to reduce costs and increase productivity.

8 Claims, 8 Drawing Sheets

U.S. PATENT DOCUMENTS

| | | | |
|---|---|---|---|
| 5,600,103 A | 2/1997 | Odaira et al. | 174/265 |
| 5,737,833 A * | 4/1998 | Motomura et al. | 29/830 |
| 6,210,518 B1 | 4/2001 | Lee et al. | 156/289 |
| 6,294,316 B1 | 9/2001 | Kaneda et al. | 430/314 |
| 6,528,874 B1 | 3/2003 | Iijima et al. | 275/700 |
| 6,555,209 B1 * | 4/2003 | Yoshimura et al. | 174/261 |

* cited by examiner

METHOD FOR INTERCONNECTING MULTI-LAYER PRINTED CIRCUIT BOARD

This application claims priority to Korean Application No. 7572/2003, filed Feb. 6, 2003 and claims the benefit of U.S. Provisional Application No. 60/463,322, filed Apr. 17, 2003. The entire disclosures of which are hereby incorporated by reference herein.

BACKGROUND OF THE INVENTION

1. Field of the Invention

The present invention relates to a printed circuit board and, more particularly, to a method for interconnecting a multi-layer printed circuit board capable of electrically connecting circuit patterns stacked by multiple layers.

2. Background of the Related Art

FIG. 1 illustrates a conventional printed circuit board fabrication method that is disclosed in Korean Patent No. 203,540 (corresponding U.S. Pat. No. 5,600,103). As shown in FIG. 1, a process in which a conductive paste is coated on a copper foil pattern 3 by a screen printing method is repeatedly performed to obtain a conical conductor bump 2' grown to a predetermined height. Then, a synthetic resin-based film type support body 4 is positioned on the conical conductor bump 2' and pressed with a roller or the like, so that the conical conductor bump 2' can penetrate and protrude from the synthetic resin-based support body 4.

Thereafter, a copper foil is placed and pressed at an upper end of the protruded conductor bump 2' to form a circuit pattern with the copper foil. In this manner, an inter connector 1 is completed.

However, the above-described printed circuit board fabrication method has various disadvantages. The process for coating the conductive paste should be repeatedly performed to form the conductor bump 2' with the predetermined height, which results in a complicated process. In addition, in order to increase the height of the conductor bump 2', a diameter of a lower portion of the conductor bump 2' should be above a certain size. Accordingly, the adjacent conductor bumps are distanced from each other, which makes it difficult to form a fine circuit pattern or obtain a compact printed circuit board. Moreover, in the repeated process of coating the conductive paste, an alignment process should be performed whenever the conductive paste is coated, which causes problems in that a productivity is degraded and a connecting force between the repeatedly coated conductive paste is also degraded.

FIGS. 2A and 2B show another conventional fabrication method of a printed circuit board disclosed in Japanese Laid Open Publication No. 2001-111189 (corresponding to U.S. Pat. No. 6,528,874) that will now be described. First, a base material 10 is prepared. As shown in FIG. 2A, the base material 10 is formed as a first copper layer 11 and a second copper layer 12 stacked together with an etching resist layer 13 therebetween.

The first copper layer 11 is for forming a connection protrusion 16 to electrically connect the stacked circuit patterns and is formed relatively thick. The second copper layer 12 is for forming the circuit pattern and is formed relatively thin.

A resist film 14 is formed at both upper surface and lower surface of the base material 10. The resist film 14 formed at the surface of the first copper layer 11 is removed to form a window 15 to form a connection protrusion 16. However, the resist film 14 is formed to cover entire surface of the second copper layer 12 as shown in FIG. 2B.

In this state, when an etching process is performed, an etching solution permeates the portion where the window 15 is formed to remove the copper layer 11 while leaving the copper layer 12 at the portion with the resist film 14 is coated. Thus, the connection protrusion 16 is formed as shown in FIG. 2C.

At this time, since etching is sequentially performed from the surface to the etching resist layer 13, the connection protrusion 16 is cone-shaped. A diameter of the connection protrusion 16 becomes smaller as it goes toward the end portion, which is called the etching factor. Since the second copper layer 12 is protected with the etching resist layer 13 and the resist film 14, the etching solution won't permeate it.

After the etching process is completed, the resist film 14 is removed. Then, the etching resist layer 13 is also removed by using an etching solution, which selectively etches only the etching resist layer 13 as shown in FIG. 2D.

Thereafter, a prepreg film 17 is placed over the connection protrusion 16 and pressed by using a roller. Then, the prepreg film 17 penetrates the connection protrusion 16 to be positioned between the connection protrusions 16 with the end portion of the connection protrusion 16 protruded on the surface of the prepreg film 17 as shown in FIG. 2E.

The end portion of the exposed connection protrusion 16 is abraded to be removed, and a third copper layer 18 is thermally pressed to form a circuit pattern. The second copper layer 12 and the third copper layer 18 are electrically connected by the connection protrusion 16 as shown in FIG. 2F. Thereafter, a circuit pattern 19 is formed through a general method on the second and third copper layers 12 and 18 to complete a printed circuit board as shown in FIG. 2G.

However, the printed circuit board fabrication method as shown in FIGS. 2A-2G has various disadvantages. As described above, to form the connection protrusion 16 with a certain height, the first copper layer 11 is formed thick, which causes much loss of a material. Further, in the etching process to form the connection protrusion 16, the diameter of the end portion of the connection protrusion 16 is smaller than the bottom portion because of the etching factor. Thus, in order to have a certain value of diameter of the end portion, the diameter of the bottom portion of the connection protrusion 16 needs to be increased. However, the diameter of the bottom portion sets an interval between the connection protrusions 16, which makes it difficult to narrow the gap between the connection protrusions 16 needed to form a fine circuit pattern. Further, the second copper layer 12 forming the circuit pattern has a thickness of below 20 mm while the first copper layer 11 forming the connection protrusion has a thickness of about 100 mm, which can cause the second copper layer 12 to be bent after the connection protrusion 16 is formed. Accordingly, it is difficult to handle the second copper layer 12.

In addition, the conventional printed circuit board fabrication methods described above use the screen printing method or the etching process to form the connection protrusion that can increase material loss, degrade rigidity of the connection protrusions and reduce productivity.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a method for interconnecting a multi-layer printed circuit board that is capable of reducing loss of a material.

Another object of the present invention is to provide a method for interconnecting a multi-layer printed circuit board that is capable of increasing a strength of a connection protrusion by forming the connection protrusion connecting circuit patterns of a multi-layer printed circuit board through a plating method.

Another object of the present invention is to provide a method for interconnecting a multi-layer printed circuit board that is capable of increasing a productivity by fabricating two boards simultaneously using a one-time process.

Another object of the present invention is to provide a method for interconnecting a multi-layer printed circuit board that is capable of reducing or preventing deformation, such as being bent, of a metal layer where a circuit pattern is formed, capable of being easily handled, and capable of improving a productivity by increasing a strength of a base material in a fabricating process of a printed circuit board.

To achieve at least these objects and other advantages in whole or in part and in accordance with the purpose of the present invention, as embodied and broadly described herein, there is provided a method for interconnecting a multi-layer printed circuit board that includes removing an etching resist layer on a first metal layer to form a plating groove that selectively exposes the first metal layer, forming a plated layer at the surface of the first metal layer exposed by the plating groove through a plating process, wherein the plated layer forms a connection protrusion, leveling a top surface of the connection protrusion, removing the etching resist layer and forming an insulation layer at the first metal layer, wherein an end portion of the connection protrusion protrudes from a surface of the insulation layer, and providing a second metal layer at the surface of the insulation layer electronically coupled to the end portion of the connection protrusion.

To further achieve at least the above objects and advantages in a whole or in part, there is provided a method for interconnecting a multi-layer printed circuit board that includes providing a base material formed with a first metal thin plate at both surfaces of a base sheet and an etching resist layer formed at a surface of the first metal thin plate, selectively removing the etching resist layer formed at the base material to form a groove exposing the first metal thin plate, plating a metal layer at the surface of the first metal thin plate exposed by the groove to fill the groove and form a connection protrusion, removing the etching resist layer and forming an insulation layer at the first metal thin plate, wherein an end portion of the connection protrusion protrudes from a surface of the insulation layer, providing a second metal thin plate at the surface of the insulation film connected to the end portion of the connection protrusion to form a substrate, separating the two substrates positioned at both sides of the base sheet, and forming a circuit pattern in the first and second metal thin plates of each of the two separated substrates.

To further achieve the above objects and advantages in a whole or in part, there is provided a method for interconnecting a multi-layer printed circuit board that includes forming an insulation layer and a patterning layer over a first metal layer, forming a plating groove in the insulation layer and the patterning layer to selectively expose the first metal layer, forming a plated layer on a surface of the first metal layer exposed by the plating groove through a plating process to form connection protrusions, and removing the patterning layer and positioning a second metal layer at a surface of the insulation layer coupled to an end portion of the connection protrusions.

To further achieve at least the above objects and advantages in a whole or in part, there is provided a method for interconnecting a multi-layer printed circuit board that includes providing a base material formed with a first metal layer at both surfaces of a base sheet and a photosensitive insulation layer and an etching resist layer sequentially formed at a surface of the first metal layer, selectively removing the photosensitive insulation layer and the etching resist layer to form a groove exposing the first metal layer, filling a metal layer at the surface of the first metal layer exposed by the groove through a plating process to form a connection protrusion, removing the etching resist layer and positioning a second metal layer at a surface of the insulation film connected to an end portion of the connection protrusion to form a substrate, separating the two substrates positioned at both sides of the base sheet, and forming a circuit pattern using each of the first and second metal layers of both the two separated substrates.

To further achieve at least the above objects and advantages in a whole or in part, there is provided a method for interconnecting a printed circuit board in which pillared connection protrusions are formed on a first metal layer and a second metal layer is connected to an upper portion of the connection protrusions that includes forming a patterning layer on a first metal layer having plating grooves that expose a surface of the first metal layer, filling a metal material in the plating groove through a plating process to form the connection protrusions, wherein an upper surface of the connection protrusion is exposed, flattening the connection protrusions to substantially equalize a height of each connection protrusion, and attaching a second metal layer onto the exposed upper surface of the connection protrusion.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS

Reference will now be made in detail to the preferred embodiments of the present invention, examples of which are illustrated in the accompanying drawings. FIGS. 3A to 3J are diagrams showing a method for fabricating a printed circuit board in accordance with a first embodiment of the present invention.

Figure 1:
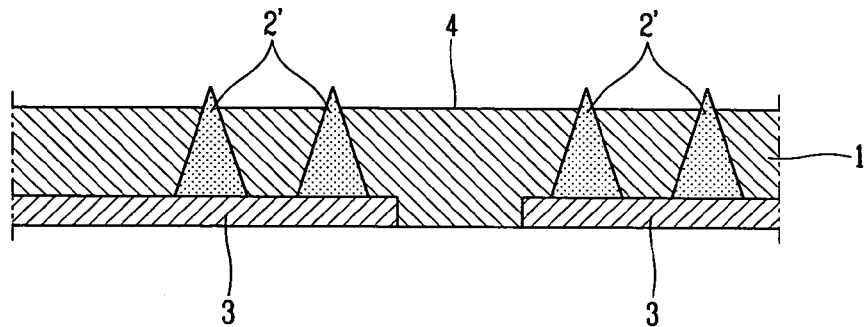
FIG. 1 is a diagram showing a conventional method for fabricating a printed circuit board.
Figure 2A:
FIGS. 2A to 2G are diagrams showing a sequential process of a conventional method for fabricating a printed circuit board.
Figure 2B:
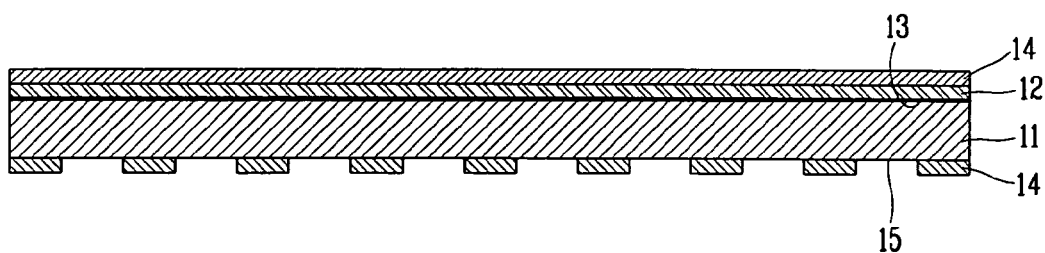
Figure 2C:
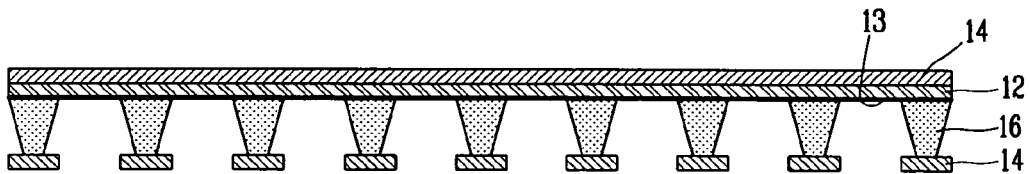
Figure 2D:
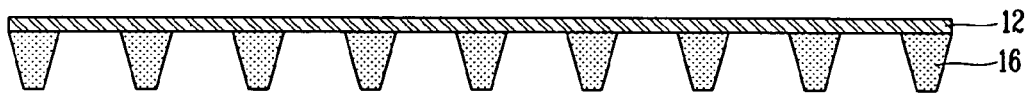
Figure 2E:
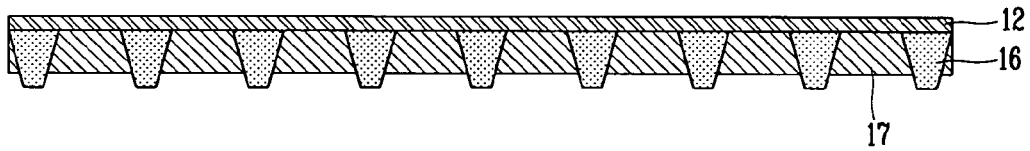
Figure 2F:
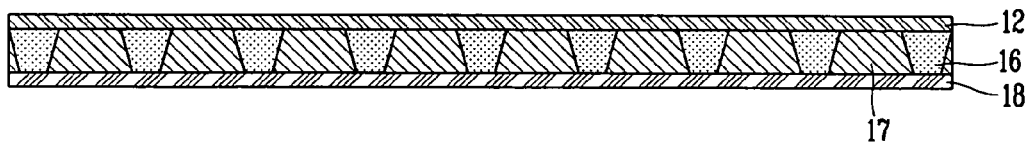
Figure 2G:
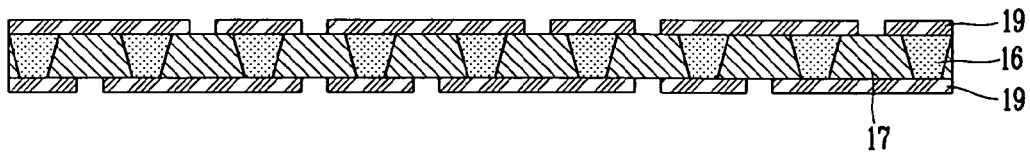
Figure 3A:
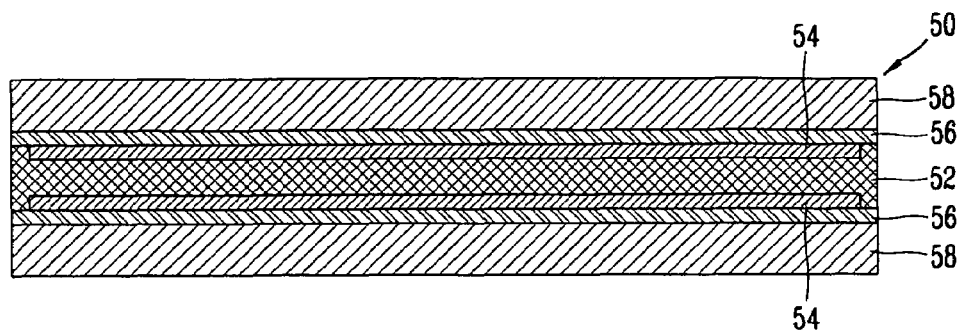
FIGS. 3A to 3J are diagrams showing a method for fabricating a printed circuit board in accordance with an embodiment of the present invention.

As shown in FIG. 3A, a base material 50 is provided. The base material 50 can include releasing films 54 positioned at both sides of a base sheet 52 with a prescribed thickness and strength, and first metal thin films 56 stacked on both sides of the base sheet 52 with the releasing films 54 attached there between.

The releasing films 54 are preferably formed smaller than the base sheet 52 so that the edge of the first metal layers 56 are directly attached to the edge of the base sheet 52. However, the first metal layers 56 and the base sheet 52 are not in contact with each other at the portion where the releasing films 54 are stacked.

The base sheet 52 made of a prepreg or the like to have a sufficient rigidity so that it can support a portion where a circuit pattern is formed, which facilitates handling of the base material 50. The first metal layers 56 are preferably made of copper. However, the present invention is not intended to be so limited. For example, the first metal layers can be made of any other material having good electrical conductivity.

For the releasing films 54, any material can be adopted so long as it can prevent attachment between the base sheet 52 and the first metal layers 56. A method for fabricating the base material is disclosed in U.S. Pat. No. 6,210,518 filed by the same assignee as the present invention.

An etching resist layer 58 such as dry films can be stacked at the surface of the first metal layers 56. The dry films 58 are preferably formed relatively thicker than a connection protrusion to be subsequently formed.

As shown in FIG. 3A, the base material 50 preferably has a structure that the upper portion and the lower portion are symmetrical centering the base sheet 52. Accordingly, follow-up processes can be simultaneously performed at both upper and lower portions of the base sheet 52.

Figure 3B:
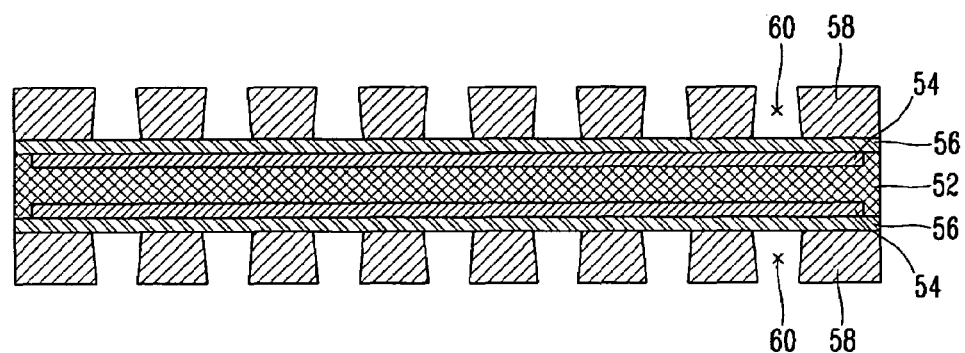

As shown in FIG. 3B, after the base material 50 is provided, the dry films 58 are preferably partially removed through an exposure/development process to form plating grooves 60. The plating grooves 60 are for forming connection protrusions 68 (e.g., to be formed later) and are formed in the dry films 58 so that the surface of the first metal layers 56 can be exposed.

Figure 3C:
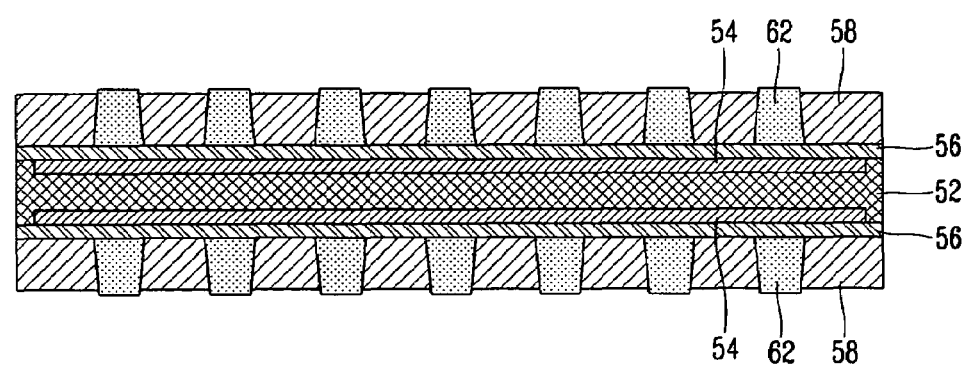

As shown in FIG. 3C, plating is preferably performed at the surface of the first metal layers 56 exposed through the plating grooves 60 to form a plated layers 62 with a prescribed height. The plated layers 62 grow and can be filled in the plating groove 60 formed at the dry films 58 and directly attached at the surface of the first metal layers 56 without a seed layer.

Preferably, after the plated layers 62 are formed, a top portion thereof can be removed. The top portion of the plated layers 62 are preferably brushed (e.g., mechanically polished) to result in each plated layer 62 having substantially the same height. Further, the top of the plated layers 62 (e.g., a bulge) are preferably removed to be substantially the same height as the dry films 58. Accordingly, a small portion of the dry films 58 may be removed.

Figure 3D:
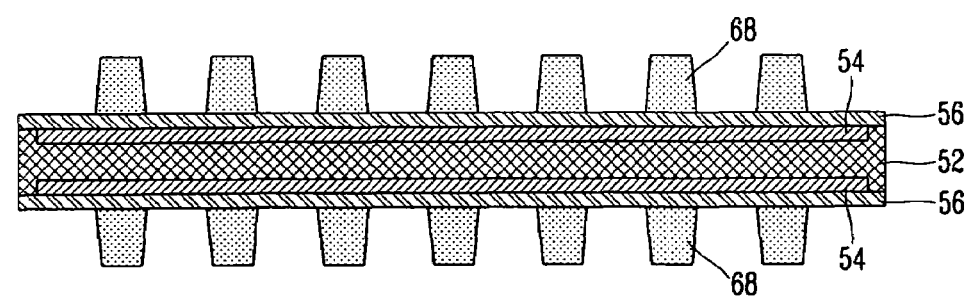

As shown in FIG. 3D, after the plated layers 62 are formed and leveled (e.g., brushed), the dry films 58 are removed and only the plated layers 62 remain at the surface of the first metal layers 56. The plated layers 62 are preferably used to form the connection protrusions 68.

Figure 3E:
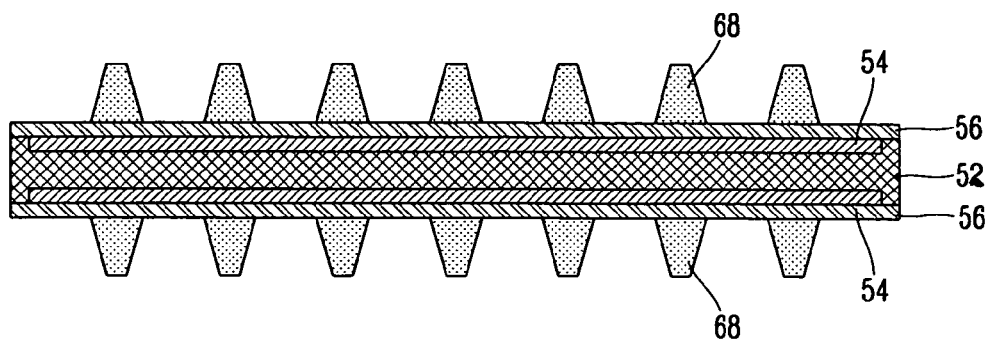

Thereafter, a soft-etching can be performed on the connection protrusions 68. As shown in FIG. 3E, after the soft-etching, the diameter of an end portion of the connection protrusions 68 become smaller than that of a bottom portion attached at the first metal layers 56. Further, the connection protrusions 68 preferably have a conical form with a cut upper end such that its diameter is gradually reduced as it goes toward the end portion. However, for example, at least the bottom portion attached to the first metal layers 56 can maintain its size.

Figure 3F:
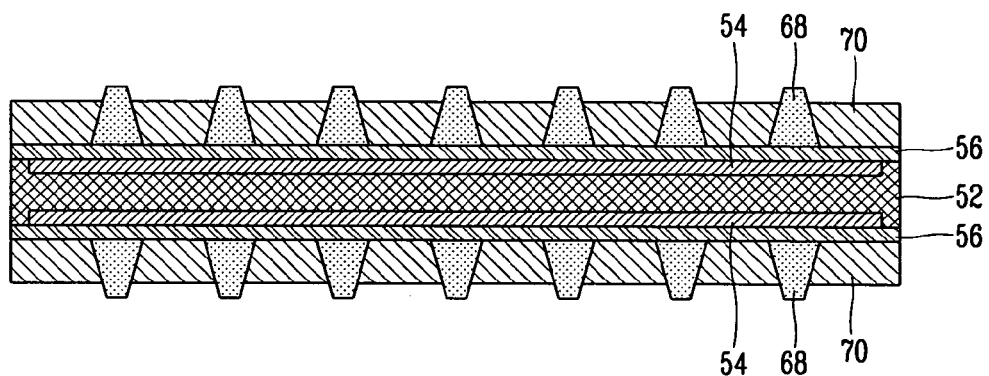

As shown in FIG. 3F, insulation layers 70 are formed at a surface of the first metal layers 56 with the connection protrusions 68 attached thereto. The insulation layers 70 can be made of a prepreg, If the prepeg is in a liquid state, it is preferably coated by using a screen printing method. If a sheet type prepreg film is used, it is preferably pressed by a roller pressing method so that the connection protrusions 68 can penetrate the prepreg film.

Figure 3G:
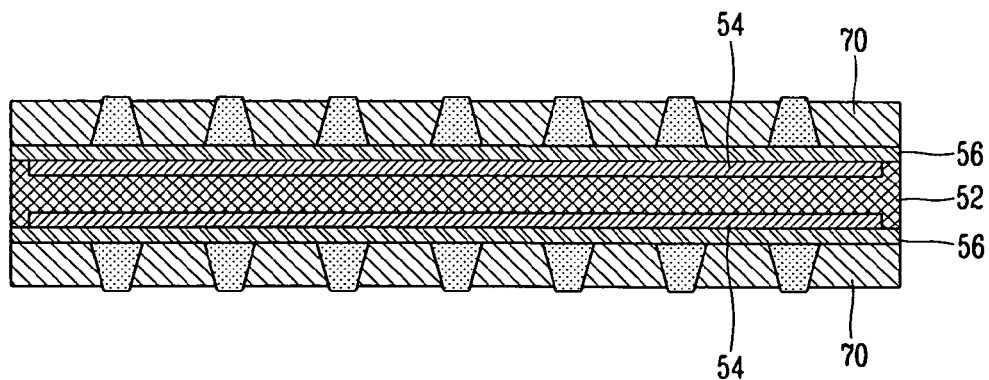

As shown in FIG. 3G, after the insulation layers 70 are formed, the end portion of the connection protrusions 68 are abraded or the like to flatten the surface of the connection protrusions 68. The end portion of the connection protrusions 68 can remain protruded to a certain degree from the surface of the insulation layers 70.

Figure 3H:
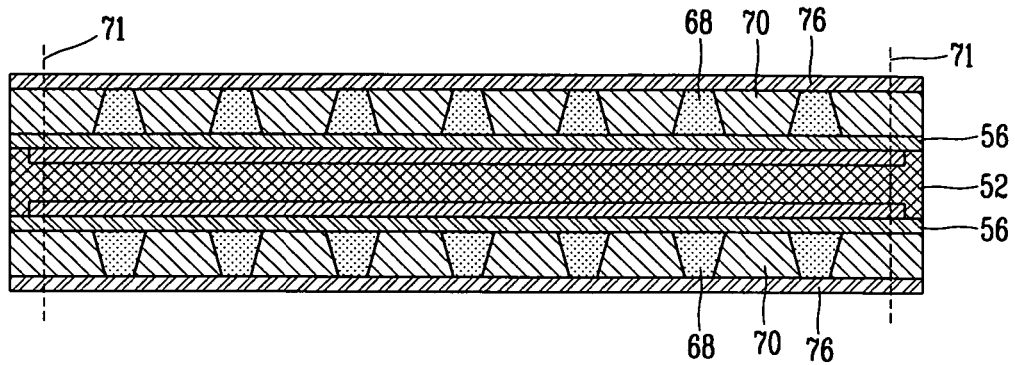

As shown in FIG. 3H, second metal layers 76 are stacked at a surface of the insulation layers 70 coupled to or in contact with the end portion of the connection protrusions 68. That is, the second metal layers 76 are preferably positioned at the surface of the insulation layers 70 and pressed by using a press. Then, the first metal layers 56 and the second metal layers 76 are electrically coupled by the connection protrusions 68. The second metal layers 76 are preferably made of copper, however any other material can be used if it has sufficient or an excellent electrical conductivity.

Figure 3I:
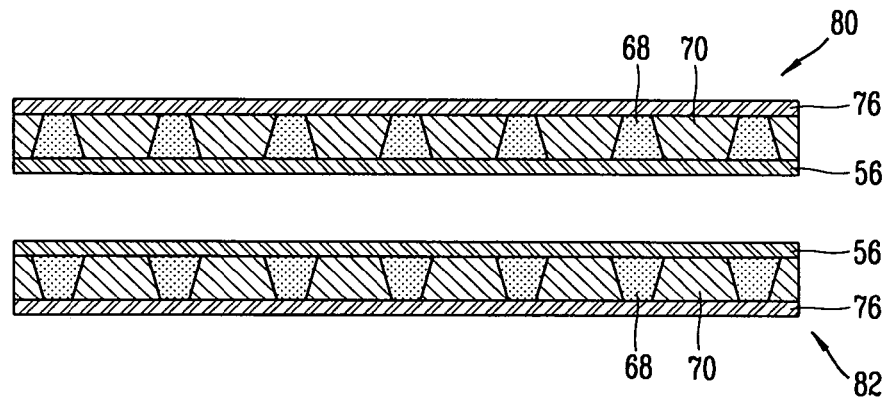

When the second metal layers 76 are completely stacked, the edge of the base material 50 stacked with the first metal layers 56 and the second metal layers 76 is preferably cut along a cut line 71 indicated as dotted line shown in FIG. 3H. Since the cut line 71, along which the edge of the base material 50 is cut, passes through a portion of the releasing films 54, the portion where the base sheet 52 and the first metal layers 56 are attached is removed. Accordingly, as shown in FIG. 3I, a first circuit board 80 and a second circuit board 82 are separated from the upper side and the lower side of the base sheet 52 by the releasing films 54 to form two circuit boards.

Figure 3J:
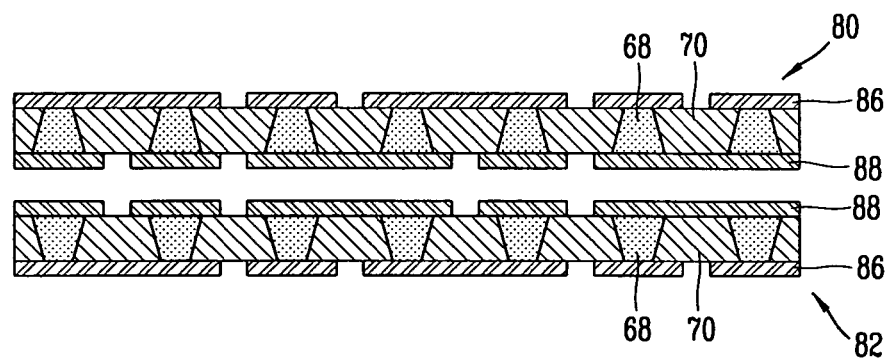

As shown in FIG. 3J, circuit patterns 86 and 88 on the separated first and second boards 80 and 82 can be formed through a known or general method. Thus, two printed circuit boards can be obtained using the method above, for example, sequentially.

FIGS. 4A to 4G are diagrams showing a method for fabricating a printed circuit board in accordance with a second embodiment of the present invention. The second embodiment of a method for fabricating a multi-layer printed circuit board in accordance with the present invention will now be described with reference to FIGS. 4A to 4G.

Figure 4A:
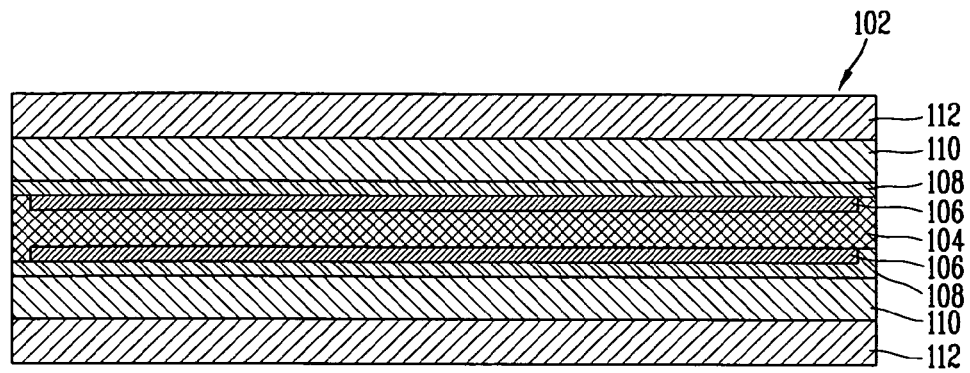
FIGS. 4A to 4G are diagrams showing a method for fabricating a printed circuit board in accordance with another embodiment of the present invention.

As shown in FIG. 4A, a base material 102 is provided. The base material 102 is formed such that a releasing films 106 are placed at both sides of a base sheet 104. The base sheet is preferably made of the prepreg. First metal layers 108 can be layered at both surfaces of the base sheet 104 having the releasing films 106 attached thereon. Photosensitive insulation materials 110 are preferably stacked at a surface of the first metal layers 108, and an etching resist layer such as dry films 112, is preferably stacked at a surface of the photosensitive insulation materials 110.

The releasing films 106 are preferably formed smaller than the base sheet 104 so that an edge of the first metal layers 108 and an edge of the base sheet 104 are directly attached to each other. However, the first metal layers 108 and the base sheet 104 are not attached to each other where the releasing films 106 are stacked.

The base sheet 104 made of prepreg is hardened to have such a sufficient rigidity in follow-up processes to support a portion where a circuit pattern is formed, and thus, the base material 102 can be easily handled. The first metal layers 108 are preferably made of copper, however, any material having good electric conductivity can be adopted for it.

The releasing films 106 can be made of any material so long as the material can sufficiently reduce or prevent attachment between the base sheet 104 and the first metal layers 108. The photosensitive insulation materials 110, for example, are made of a liquid phase or a film type of polyimide. The photosensitive insulation materials 110 serve as an insulation layer of the printed circuit board.

As shown in FIG. 4A, the base material 102 preferably has a structure that the upper portion and the lower portion of the base sheet 104 are symmetrical. Accordingly, follow-up processes can be simultaneously performed at both upper portion and lower portion of the base sheet 104.

Figure 4B:
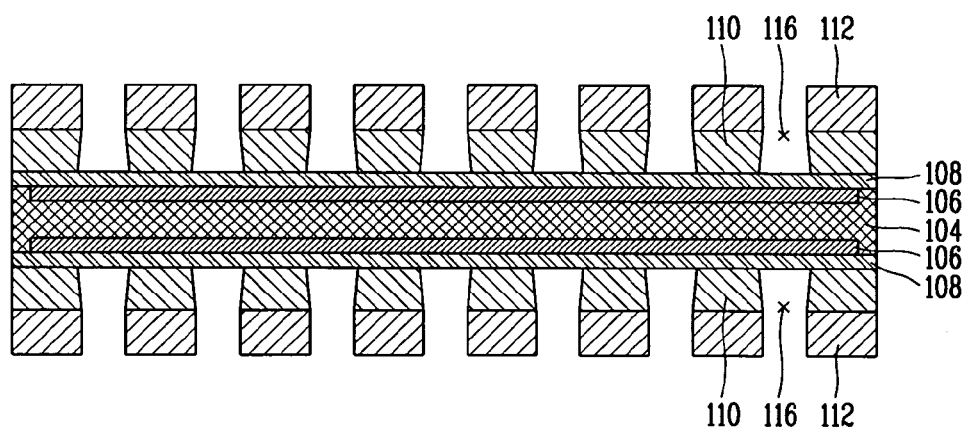

As shown in FIG. 4B, after the base material 102 is prepared, the base material 102 is subjected to a general exposure/development process to partially remove the dry films 112 and the photosensitive insulation layers 110 to form plating grooves 116. The plating grooves 116 are for forming connection protrusions 124 as described below. The plating grooves 116 preferably penetrate the dry films 112 and the photosensitive insulation layers 110 to expose the surface of the first metal layers 108.

Figure 4C:
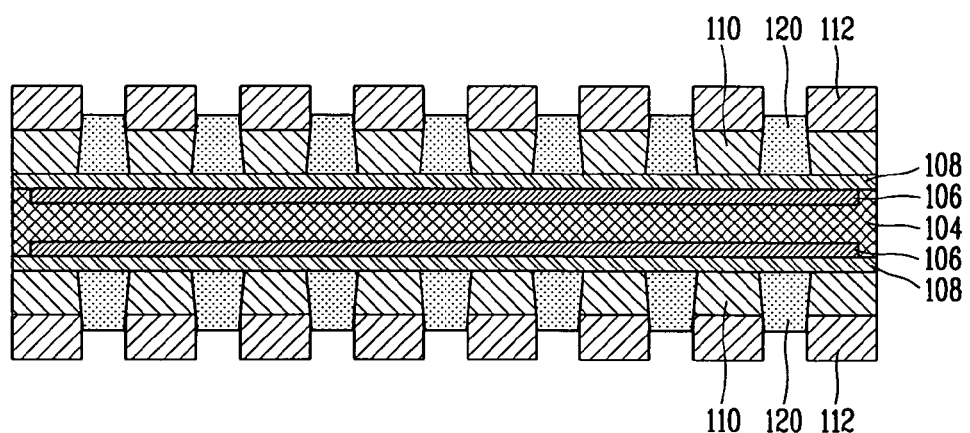

As shown in FIG. 4C, plating is performed at the surface of the first metal layers 108 exposed through the plating grooves 116 to form the plated layers 120. The plated layers 120 are preferably filled in the plating grooves 116, attached at the surface of the first metal layers 108, formed higher than the photosensitive insulation layers 110 but not protruded from the surface of the dry films 112.

Figure 4D:
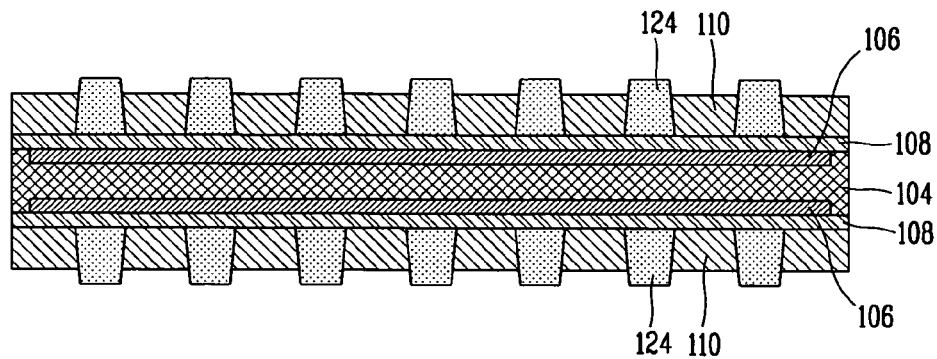

After the plated layers 120 are formed, the dry films 112 are removed to leave only the plated layers 120 and the insulation materials 110 at the surface of the first metal layers 108. As shown in FIG. 4D, the remaining plated layers 120 form the connection protrusions 124.

Optionally, after the remaining plated layers 120 are formed, a top portion thereof can be removed. The top portion of the plated layers 120 can be brushed (e.g., mechanically polished) to result in each plated layer 120 having substantially the same height. Further, the top of the plated layers 120 (e.g., a bulge) can be removed to be substantially the same height as the dry films 110. Accordingly, a slight portion of the dry films 110 may be removed.

Figure 4E:
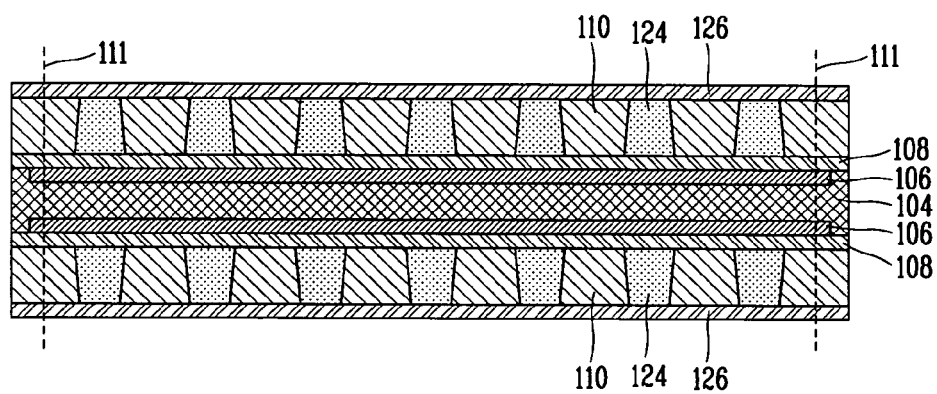

As shown in FIG. 4E, the second metal layers 126 can be stacked at the surface of the insulation materials 110 coupled to or in contact with the end portion of the connection protrusions 124. The second metal layers 126 are preferably positioned at a surface of the photosensitive insulation materials 110 and pressed by a press so that the first metal layers 108 and the second metal layers 126 can be electrically coupled to the connection protrusions 124. The second metal layers 126 can be made of copper or any other material so long as the material has an excellent electrical conductivity.

When the second metal layers 126 are completely stacked, the edge of the base material 102 with the first metal layers 108 and the second metal layers 126 stacked is removed, for example, by being cut along a cut line 111 indicated by a dotted line shown in FIG. 4E. Since the cut line 111 passes through a portion of the releasing film 106, the portion where the base sheet 104 attaches to the first metal layers 108 is removed. Accordingly, a first circuit board 130 and a second circuit board 132 are respectively separated from the upper side and the lower side of the base sheet 104 because of the releasing films 106.

Figure 4F:
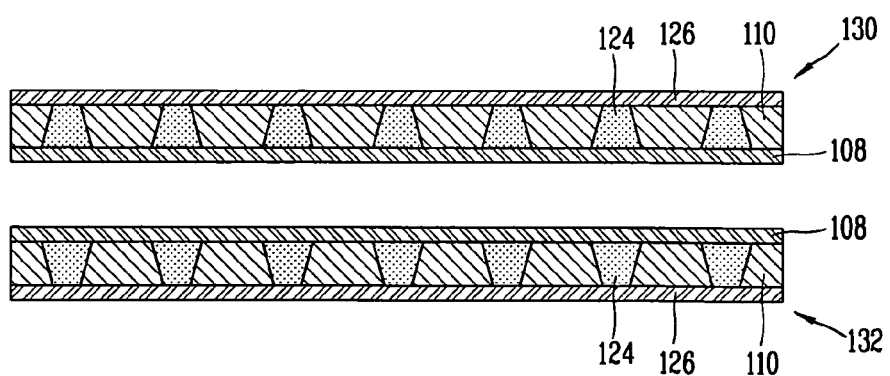
Figure 4G:
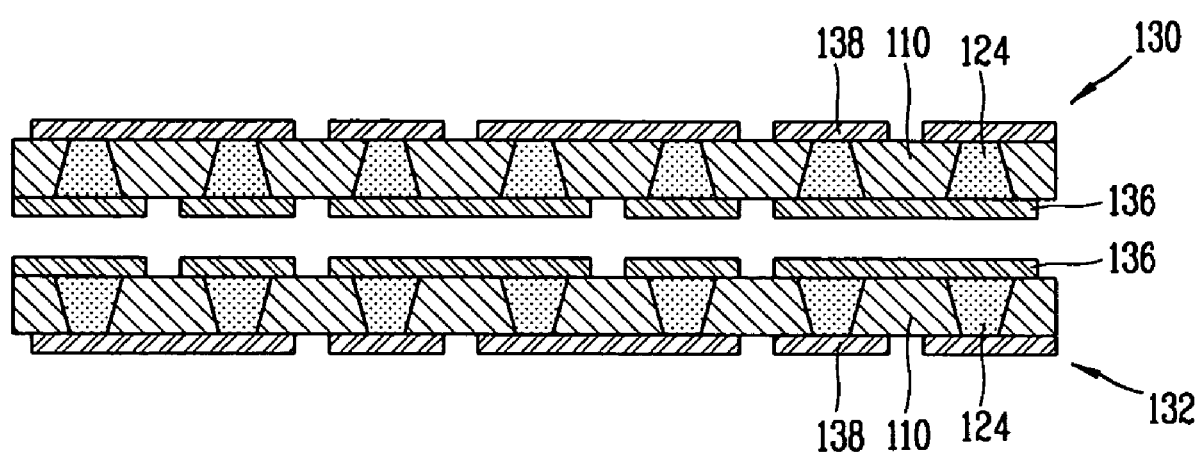

As shown in FIG. 4F, two boards 130 and 132 are formed. By forming circuit patterns 136 and 138 on the separated first and second boards 130 and 132 through the general method, two printed circuit boards can be obtained as shown in FIG. 4G.

Any reference in this specification to "one embodiment," "an embodiment," "first embodiment," "second embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

As described above, embodiments of a method for fabricating a multi-layer printed circuit board according to the present invention have various advantages. According to embodiments of the present invention, the base sheet made of prepreg provided at the center of the base material can give the base material a sufficient rigidity so that the base material can be easily handled and productivity can be increased. Further, the connection protrusions are formed through the plating process to electrically couple the circuit patterns and a material loss can be reduced compared to the case of using the screen printing method or etching, and a rigidity of the connection protrusion can be also increased. In addition, since the printed circuit boards can be fabricated at an upper side and at a lower side of the base sheet, two printed circuit boards can be fabricated using a one-time fabrication process, and thus, a productivity can be increased.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for interconnecting a multi-layer printed circuit board, comprising:

selectively removing portions of an etching resist layer provided on at least one first metal layer to form a plating groove that selectively exposes a corresponding portion of the at least one first metal layer;

forming a plated layer at the surface of the first metal layer exposed by the plating groove through a plating process, wherein the plated layer forms a connection protrusion;

leveling a top surface of the connection protrusion;

removing a remaining portion the etching resist layer;

forming an insulation layer at the at least one first metal layer, wherein an end portion of the connection protrusion protrudes from a surface of the insulation layer, and wherein the connecting protrusion is formed by abrading and flattening the end portion of the connection protrusion which protrudes from the surface of the insulation layer after the insulation layer is formed; and providing a second metal layer at the surface of the insulation layer which is electronically coupled to the end portion of the connection protrusion, wherein the at least one first metal layer comprises two first metal layers, wherein a first metal layer is provided on each of two opposite sides of a base sheet, with an etching resist layer provided on a side of each first metal layer not in contact with the base sheet to form a base material from the base sheet, the first metal layers, and the etching resist layers, the method further comprising:

separating the first metal layer, insulation layer, and second metal layer formed on one side of the base sheet from the first metal layer, insulation layer, and second metal layer formed on the other side of the base sheet to form two separate substrates; and forming a circuit pattern in the first and second metal layers of each of the two separated substrates.

2. The method of claim 1, further comprising providing a releasing film interposed between the base sheet and each of the first metal layers, wherein each first metal layer is configured to be separated from the base sheet after a printed circuit board is completed.

3. The method of claim 2, wherein the releasing film is formed smaller than the base sheet so that an edge of the base sheet and an edge of the first metal layer are configured to be attached to each other, wherein the attached edges are removed so as to separate the two substrates from the base sheet.

4. The method of claim 2, wherein the separating the two substrates comprises cutting both an edge of the base material and a portion of each releasing film to release an attachment between the base sheet and each first metal layer.

5. The method of claim 1, wherein the base sheet is made of prepreg, wherein the first and second metal layers are made of copper, wherein each etching resist layer is made of a dry film, wherein each insulation layer is made of prepreg, and wherein the base material is symmetrically formed on the two opposite sides of the base sheet.

6. The method of claim 1, further comprising soft etching each connection protrusion to reduce a diameter of the end portion of the connection protrusion relative to a bottom portion attached to its respective first metal layer.

7. The method of claim 1, wherein each insulation layer is prepreg, wherein the prepreg is coated through a screen printing method when the prepreg is a liquid, wherein a roller pressing method is used to fabricate each insulation layer when the prepreg is a sheet type of prepreg film, and wherein each connection protrusion is formed by abrading and flattening the end portion thereof protruded from the surface of its respective insulation layer.

8. The method of claim 1, wherein selectively removing portions of an etching resist layer, forming a plated layer, leveling a top surface of the connection protrusion, removing a remaining portion the etching resist layer, forming an insulation layer, and providing a second metal layer at the surface of the insulation layer are each conducted simultaneously on each side of the base sheet so as to produce features of the two substrates simultaneously.

* * * * *